United States Patent [19]

Kuroda et al.

[11] Patent Number: 4,593,267
[45] Date of Patent: Jun. 3, 1986

[54] DIGITAL DATA CODE CONVERSION CIRCUIT FOR VARIABLE-WORD-LENGTH DATA CODE

[75] Inventors: Hideo Kuroda, Yokosuka; Naoki Mukawa, Yokohama; Kiichi Matsuda, Kawasaki; Toshihiro Honma; Hiroshi Fukuda, both of Yokohama, all of Japan

[73] Assignees: Nippon Telegraph & Telephone Public Corporation, Tokyo; Fujitsu Limited, Kawasaki, both of Japan

[21] Appl. No.: 509,398

[22] Filed: Jun. 30, 1983

[30] Foreign Application Priority Data

Jun. 30, 1982 [JP] Japan .................................. 57-111445
Jun. 30, 1982 [JP] Japan .................................. 57-111446

[51] Int. Cl.$^4$ ............................................. H03K 13/24
[52] U.S. Cl. ............................... 340/347 DD; 364/200; 364/900

[58] Field of Search ..................... 364/200, 900; 340/347 DD

[56] References Cited

U.S. PATENT DOCUMENTS 4,023,023 5/1977 Bourrez et al. .................. 364/400
4,044,347 8/1977 Van Voorhis ............... 340/347 DD
4,250,548 2/1981 Kindell ............................ 364/200

Primary Examiner—David Smith, Jr.
Attorney, Agent, or Firm—Staas & Halsey

[57] ABSTRACT

A digital data code conversion circuit for a variable-word-length data code includes a data code conversion portion and a preparation circuit. In the preparation circuit, a variable-word-length data code having a word length greater than a number n is divided into a plurality of variable-word-length data codes having a word length less than or equal to the number n. The divided variable-word-length data codes are converted into fixed-word-length data codes having a word length n in the data code conversion portion.

5 Claims, 16 Drawing Figures

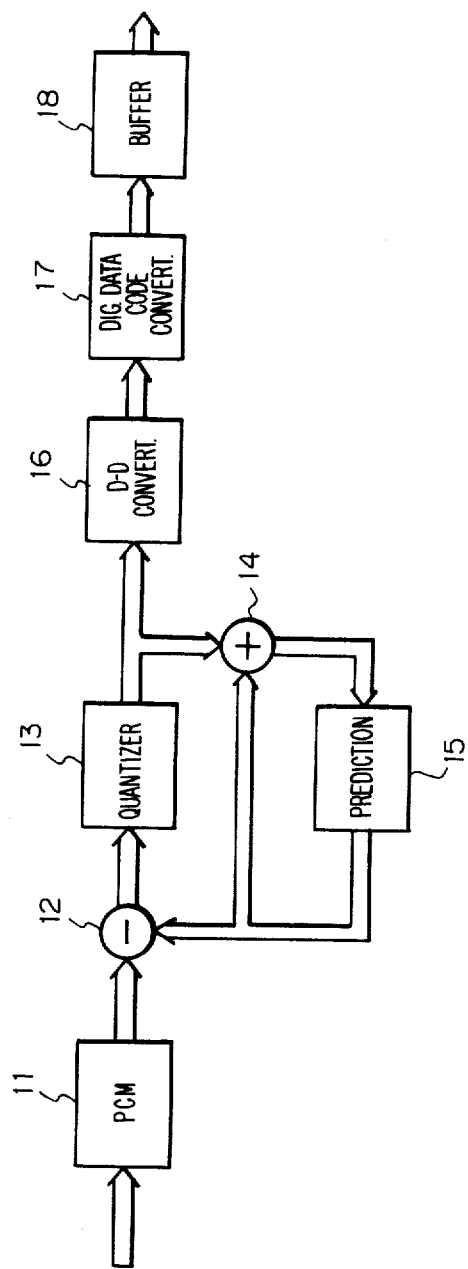

Fig. 2

| QUANTUM LEVEL | VARIABLE-LENGTH DATA CODE | BIT NUMBER |
|---|---|---|
| 0 0 0 0 | 1 | 1 |
| 0 0 0 1 | 0 1 | 2 |
| 0 0 1 0 | 0 0 1 | 3 |
| 0 0 1 1 | 0 0 0 1 | 4 |
| 0 1 0 0 | 0 0 0 0 1 | 5 |
| 0 1 0 1 | 0 0 0 0 0 1 | 6 |
| 0 1 1 0 | 0 0 0 0 0 0 1 | 7 |
| 0 1 1 1 | 0 0 0 0 0 0 0 1 | 8 |
| 1 0 0 0 | 0 0 0 0 0 0 0 0 1 | 9 |
| 1 0 0 1 | 0 0 0 0 0 0 0 0 0 1 | 10 |
| 1 0 1 0 | 0 0 0 0 0 0 0 0 0 0 1 | 11 |
| 1 0 1 1 | 0 0 0 0 0 0 0 0 0 0 0 1 | 12 |
| 1 1 0 0 | 0 0 0 0 0 0 0 0 0 0 0 0 1 | 13 |
| 1 1 0 1 | 0 0 0 0 0 0 0 0 0 0 0 0 0 1 | 14 |
| 1 1 1 0 | 0 0 0 0 0 0 0 0 0 0 0 0 0 0 1 | 15 |
| 1 1 1 1 | 0 0 0 0 0 0 0 0 0 0 0 0 0 0 0 1 | 16 |

INPUT DATA

OUTPUT DATA

Fig. 7

| INPUT DATA CODE | | FIRST OUTPUT DATA CODE | | SECOND OUTPUT | |
|---|---|---|---|---|---|
| BIT NUMBER | WORD LENGTH INFORMATION | BIT NUMBER | WORD LENGTH INFORMATION | BIT NUMBER | WORD LENGTH INFORMATION |
| 0 | 00000 | 0 | 0000 | 0 | 0000 |
| 1 | 00001 | 1 | 0001 | 0 | 0000 |
| 2 | 00010 | 2 | 0010 | 0 | 0000 |
| 3 | 00011 | 3 | 0011 | 0 | 0000 |
| 4 | 00100 | 4 | 0100 | 0 | 0000 |
| 5 | 00101 | 5 | 0101 | 0 | 0000 |
| 6 | 00110 | 6 | 0110 | 0 | 0000 |
| 7 | 00111 | 7 | 0111 | 0 | 0000 |
| 8 | 01000 | 8 | 1000 | 0 | 0000 |
| 9 | 01001 | 8 | 1000 | 1 | 0001 |
| 10 | 01010 | 8 | 1000 | 2 | 0010 |
| 11 | 01011 | 8 | 1000 | 3 | 0011 |
| 12 | 01100 | 8 | 1000 | 4 | 0100 |
| 13 | 01101 | 8 | 1000 | 5 | 0101 |
| 14 | 01110 | 8 | 1000 | 6 | 0110 |
| 15 | 01111 | 8 | 1000 | 7 | 0111 |
| 16 | 10000 | 8 | 1000 | 8 | 1000 |

Fig. 14

| CNT | 0 | 2 | 2 | 3 | 4 | 5 | 6 | 7 |
|---|---|---|---|---|---|---|---|---|
| $C_1$ | 0 | 1 | 1 | 1 | 1 | 1 | 1 | 1 |
| $C_2$ | 0 | 0 | 1 | 1 | 1 | 1 | 1 | 1 |
| $C_3$ | 0 | 0 | 0 | 1 | 1 | 1 | 1 | 1 |
| $C_4$ | 0 | 0 | 0 | 0 | 1 | 1 | 1 | 1 |
| $C_5$ | 0 | 0 | 0 | 0 | 0 | 1 | 1 | 1 |
| $C_6$ | 0 | 0 | 0 | 0 | 0 | 0 | 1 | 1 |
| $C_7$ | 0 | 0 | 0 | 0 | 0 | 0 | 0 | 1 |
| $C_8$ | 0 | 0 | 0 | 0 | 0 | 0 | 0 | 0 |

DIGITAL DATA CODE CONVERSION CIRCUIT FOR VARIABLE-WORD-LENGTH DATA CODE

BACKGROUND OF THE INVENTION

1. Field of the Invention

The present invention relates to a digital data code conversion circuit for a variable-word-length data code. More particularly, the present invention relates to a digital data code conversion circuit for a variable-word-length data code wherein a preparation circuit is provided for dividing a parallel input variable-word-length data code into data codes having word lengths less than or equal to a predetermined length.

2. Description of the Prior Art

Generally, in digital data transmission, two types of data coding systems are used. One type is a variable-word-length data coding system wherein the number of bits contained in one word is varied in accordance with the content of the data. The other type is a fixed-word-length data coding system wherein the number of bits contained in one word is always constant. The variable-word-length data coding system has the advantage that the total number of bits required for the same amount of information is smaller than the fixed-word-length data coding system. Accordingly, the variable-word-length data coding system is widely used in the transmission of a video signal, a voice signal, etc. However, in the variable-word-length data coding system, the number of bits contained in one word can be different for each word. It is inconvenient processing data words having different word lengths without any conversion, and the circuit construction for processing the data words can become complicated. The disadvantage of the variable-word-length data coding system can be eliminated by dividing and combining a series of data codes having different lengths to convert them into a series of parallel data codes having fixed lengths. To accomplish this, a conversion circuit for converting a variable-word-length data code into a fixed-word-length data code is required.

A prior art digital data code conversion circuit for a variable-word-length data code is disclosed in Japanese Patent Application No. 55-017,259. In this digital data code conversion circuit, code pattern information for a variable-word-length data code having a word length of up to n bits is input in parallel through data input terminals, and word-length information representing the number of bits of the input variable-word-length data code is input through word-length input terminals. The input variable-word-length data code is converted in the conversion circuit, and a fixed-word-length data code with n-bits is output.

In the above-mentioned digital data code conversion circuit, since the word lengths of data codes processed by the conversion circuit are required to be less than or equal to n-bits, it is necessary to make the bit number n processed in parallel larger if the maximum bit number of the input variable-word-length data code becomes larger. This means that the circuit structure becomes more complicated and the scale of the device becomes larger.

SUMMARY OF THE INVENTION

Another object of the present invention is to provide a digital data code conversion circuit for a variable-word-length data code, wherein a preparation circuit for dividing an input variable-word-length data code into data codes having a word length less than or equal to a predetermined value is provided so that a data code having a word length larger than that of output fixed-word-length data can be processed, whereby input data codes having a large maximum word length can be processed by a device having a relatively small circuit scale.

Another object of the present invention is to provide a digital data code conversion circuit for a variable-word-length data code, wherein the construction of a control circuit and the control operation can be simplified.

In accordance with the present invention, there is provided a digital data code conversion circuit for a variable-word-length data code having a data code conversion portion and a preparation circuit. The data code conversion portion converts variable-word-length data codes having a word length less than or equal to a predetermined number n into fixed-word-length data codes having a word length equal to the predetermined number n. It does so by dividing and combining input variable-word-length data codes according to word-length information. The preparation circuit precedes the data code conversion portion. The preparation circuit divides an input variable-word-length data code having a word length greater than the predetermined number n into different variable-word-length data codes having a word length less than or equal to the predetermined number. It also produces word-length information for the divided variable-word-length data codes. The data code conversion portion has an operation rate proportional to the data input rate multiplied by the number of divisions of the variable-word-length data codes.

BRIEF DESCRIPTION OF THE DRAWINGS

FIG. 1A is a block diagram of a system for encoding and transmitting a variable-word-length data code;

FIG. 2 is one example of a conversion table for converting a fixed-word-length data code into a variable-word-length data code;

FIG. 7 is a conversion table for word-length information converted in the preparation circuit of FIG. 6;

FIG. 14 is a conversion table for the control signals for the second selector circuit of FIG. 13.

DESCRIPTION OF THE PREFERRED EMBODIMENTS

Figure 1B:
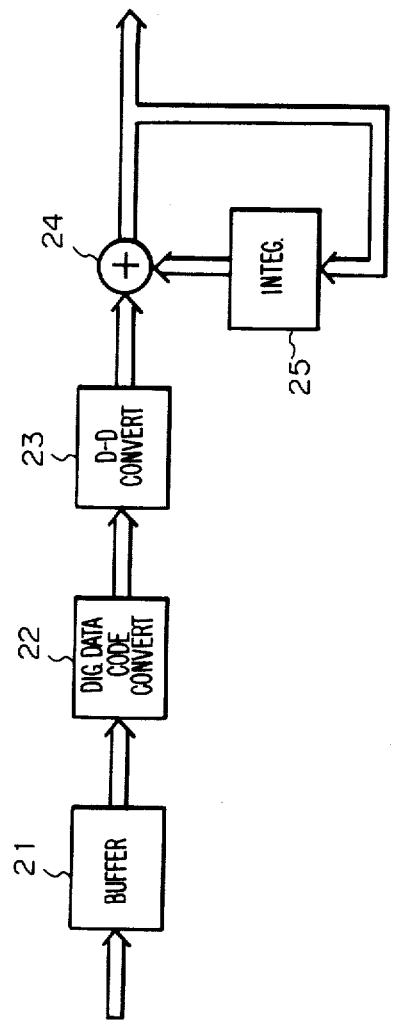
FIG. 1B is a block diagram of a system for receiving and decoding a variable-word-length data code.

Before describing the preferred embodiments of the present invention, systems for encoding and decoding a variable-word-length data code are described, to which systems a data code conversion circuit according to the present invention is applied. A system for encoding a variable-word-length data code is illustrated in FIG. 1A, and a system for decoding a variable-word-length data code is illustrated in FIG. 1B.

The system of FIG. 1A includes a pulse-coded modulator 11, a subtracter 12, a quantizing circuit 13, an adder 14, a prediction circuit 15, a digital-to-digital converter 16, a digital data code conversion circuit 17, and a buffer memory 18. In the system of FIG. 1A, an input data signal, such as a video signal or a voice signal, is supplied to the pulse-coded modulator 11, and a parallel 8-bit pulse-code modulation (PCM) data code is output from the pulse-coded modulator 11. The PCM data code is supplied to the substracter 12, has subtracted from it a predicting value from the prediction circuit 15, and is then supplied to the quantizing circuit 13. In the quantizing circuit 13, the supplied data code is quantized at several quantum levels, for example, 8 levels or 16 levels, and one quantum level signal is output from the quantizing circuit 13. The quantum level signal is supplied to the adder 14 and to the digital-to-digital converter 16. In the adder 14, the quantum level signal is added to the forgoing predicting value and is supplied to the prediction circuit 15 as the next predicting value. In the digital-to-digital converter 16, the quantum level signal is converted into a variable-word-length data code.

One example of variable-word-length data codes is illustrated in FIG. 2. In the example of FIG. 2, the input data is quantized in 16 quantum levels, and each of these quantum levels corresponds to one data pattern of 4 bits as shown in FIG. 2. These quantum levels (i.e., data patterns) are converted into variable-word-length data codes, which codes have word lengths differing from each other from 1 bit to 16 bits. The word length of each variable-word-length data code is assigned so that the data code corresponding to the quantum level having a smaller absolute value has a shorter word length. Since the quantum level signals output from the quantizing circuit 13 represent the difference between the actual signal data and its predicting value, most of the samples of the output quantum level signals have small absolute values. Thus, the average word length of the variable-word-length data codes being output from the digital-to-digital converter 16 becomes very small, for example, 2 or 3 bits. Accordingly, the total data length of information to be transmitted becomes shorter in the variable-word-length data codes than in the PCM data codes.

The variable-word-length data codes output from the digital-to-digital converter 16 are supplied to the digital data code conversion circuit 17 and are converted into fixed-word-length data codes. The operation of the digital data code conversion circuit 17 will be described in detail later. The fixed-word-length data codes from the conversion circuit 17 are supplied to the buffer memory 18 and are stored therein. The stored data codes are transmitted by a transmitting circuit (not shown).

The system for decoding the variable-word-length data code of FIG. 1B includes a buffer memory 21, a digital data code conversion circuit 22, a digital-to-digital converter 23, an adder 24, and an integrating circuit 25. In the system of FIG. 1B, the received data codes transmitted from the system of FIG. 1A are stored in the buffer memory 21. The stored data codes are supplied to the digital data code conversion circuit 22 and are converted into variable-word-length data codes as shown in FIG. 2. The variable-word-length data codes from the conversion circuit 22 are supplied to the digital-to-digital converter 23 and are converted into quantum level signals. The quantum level signals for the digital-digital converter 23 are supplied to the adder 24 and are added to the output date codes from the integrating circuit 25. Thus, the output data codes from the adder 24 are output as reproduced PCM data codes.

Figure 3:
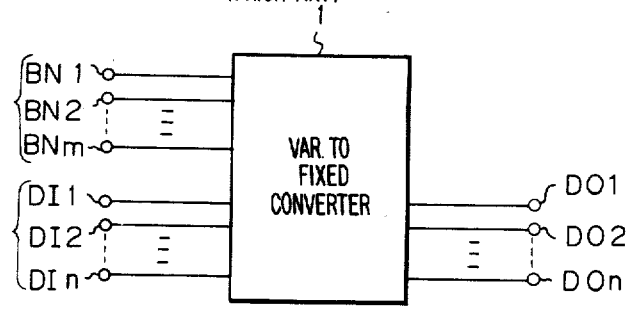
FIG. 3 is a block diagram of a prior art digital data code conversion circuit for a variable-word-length data code.

A prior art digital data code conversion circuit for a variable-word-length data code which may be used in the system of FIG. 1A is illustrated in FIG. 3. The digital data code conversion circuit 1 of FIG. 3 has n-bit code pattern information input terminals DI1, DI2, - - -, DIn; m-bit word-length information input terminals BN1, BN2, - - -, DNm; and n-bit output terminals DO1, DO2, - - -, DOn. In the digital data code conversion circuit 1 of FIG. 3, variable-length data codes being input from the code pattern information input terminals DI1, DI2, - - -, DIn are converted into fixed-word-length data codes, and the converted n-bit fixed-word-length data codes are output from the output terminals DO1, DO2, - - -, DOn.

Figure 4A:
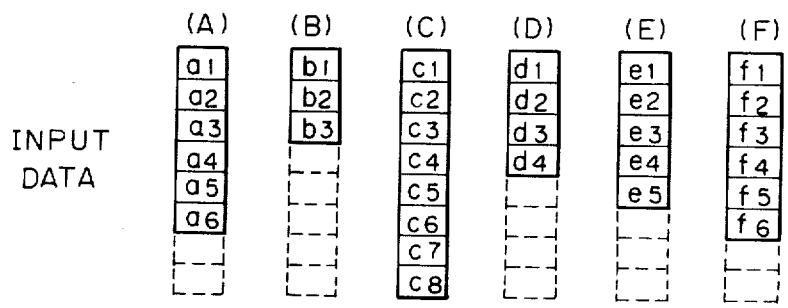
FIGS. 4A is one example of an input data series
Figure 4B:
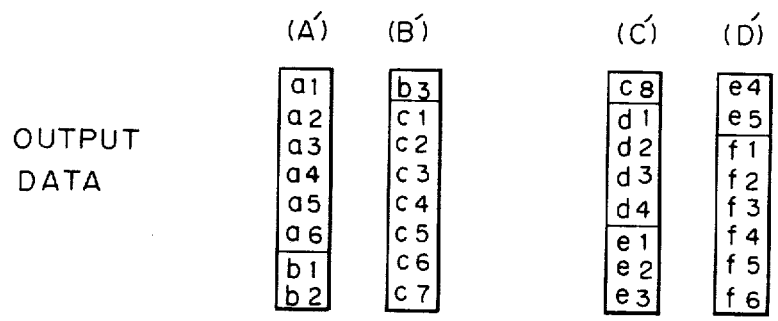
FIG. 4B is a corresponding output data series in the conversion circuit of FIG. 3.

The operation of the digital data code conversion circuit 1 of FIG. 3 is described with reference to the input and output data example of FIG. 4. In the example of FIG. 4, variable-word-length data codes have a word length less than or equal to 8 bits. Input data series (A), (B), - - -, (F) are input into the digital data code conversion circuit 1 in sequence. Since the first input data (A) is 6-bit data, the leading 2 bits of the next input data (B) are attached to the end of the input data (A), and the 8-bit output data (A') is output. Then, since the last 1 bit of the input data (B) remains, the leading 7 bits of the next input data (C) are attached to the remaining 1 bit, and the 8-bit output data (B') is output. Since the last 1 bit of the input data (C) remains, all 4 bits of the next input data (D) are attached to the remaining 1 bit. Further, the leading 3 bits of the next input data (E) are attached to the 4 bits of the input data (D), and the 8-bit output data (C') is output. Then, since the last 2 bits of the input data (E) remain, all 6 bits of the next input data (F) are attached to the remaining 2 bits, and the 8-bit output data (D') is output. As was described above, input variable-word-length data codes are converted into output fixed-word-length data codes by dividing and combining the input data codes.

The above-mentioned conversion operation may be carried out by the circuit disclosed in the foregoing Japanese Patent Application No. 55-017,259. However, in the above-mentioned digital data code conversion circuit, the word length of an input variable-word-length data code must be less than or equal to n the number of bits of the output fixed-word-length data code. Thus, an input data code having a word length greater than the number n cannot be processed by the data code conversion circuit. For example, the variable-word-length data codes shown in FIG. 2, which have 16 bits at the maximum, cannot be processed by the above-mentioned 8-bit data code conversion circuit.

Figure 5:
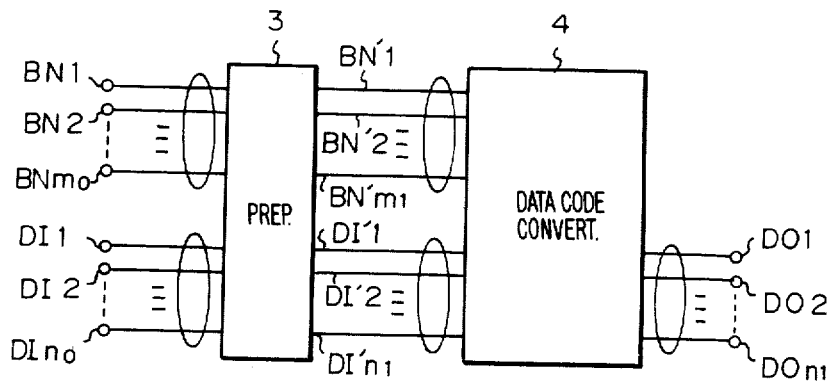
FIG. 5 is a block diagram of a digital data code conversion circuit for a variable-word-length data code according to the present invention.

A digital data code conversion circuit for a variable-word-length data code according to the present invention is illustrated in FIG. 5. The digital data code conversion circuit of FIG. 5 comprises a preparation circuit 3 and a data code conversion portion 4. In the data code conversion circuit of FIG. 5, the preparation circuit 3 has variable-word-length data pattern input terminals DI1, DI2, - - -, DIn$_0$, word-length input terminals BN1, BN2, - - -, BNm$_0$, variable-word-length data pattern output terminals DI'1, DI'2, - - -, DI'n$_1$, and word-length output terminals BN'1, BN'2, - - -, BN'm$_1$.

In the preparation circuit 3, an input variable-word-length data code having a word length less than or equal to the number $n_0$ is divided into variable-word-length data codes having word lengths less than or equal to the number $n_1$ ($n_1 < n_0$). For example, if $n_0 = 16$ and $n_1 = 8$, when a 15-bit data code is input into the preparation circuit 3, the 15-bit data code is divided into two data codes having 8 bits and 7 bits, respectively. A piece of word-length information representing 15 bits is input into the preparation circuit 3 along with the 15-bit data code and is divided into two pieces of word-length information representing 8 bits and 7 bits, respectively. The 8-bit data code and the 7-bit data code are supplied in sequence to the data code conversion portion 4 along with the pieces of word-length information representing 8 bits and 7 bits. These two data codes are processed in the data code conversion portion 4 in the same manner as in the conversion circuit 1 of FIG. 3. The data code conversion portion 4 is operated at a rate proportional to the data input rate multipled by the number of times the maximum length ($n_0$) input variable-word-length data code is divided by the preparation circuit 3 to form words having a length less than or equal to $n_1$, i.e., the operation rate is proportional to the data input rate times $n_1/n_0$.

Figure 6:
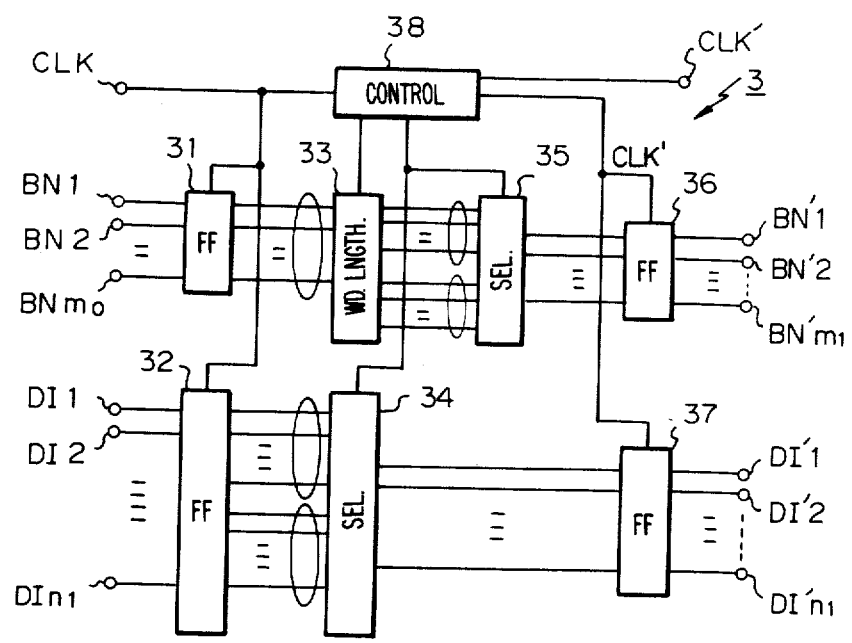
FIG. 6 is a circuit diagram of one embodiment of the preparation circuit in the conversion circuit of FIG. 5.

One embodiment of the preparation circuit 3 of FIG. 5 is illustrated in FIG. 6. The preparation circuit 3 of FIG. 6 comprises a flip-flop circuit 31 for receiving the input word-length information, a flip-flop circuit 32 for receiving the input data code information, a word-length information conversion circuit 33 for converting the input word-length information into word-length information for the divided data codes, a data code selector circuit 34 for selecting one data code from the divided data codes, a word-length selector circuit 35 for selecting one piece of word-length information from the pieces of information for the divided data codes, a flip-flop circuit 36 for outputting the word-length information for the divided data code, a flip-flop circuit 37 for outputting the divided data code, and a control circuit 38 for controlling the above-mentioned circuits 31 through 37.

The operation of the preparation circuit 3 of FIG. 6 is described with reference to the foregoing example. Word-length information representing 15 bits and the 15-bit data code are written into the flip-flop circuits 31 and 32, respectively, by the clock signal CLK. The word-length information written into the flip-flop circuit 31 is supplied to the word-length information conversion circuit 33 and is converted into two pieces of word-length information representing 8 bits and 7 bits. On the other hand, the data code written into the flip-flop circuit 32 is supplied to the data code selector circuit 34 and is divided into two data codes, one which consists of the most significant 8 bits and the other which consists of the least significant 7 bits. The data code consisting of the most significant 8 bits is output first, and the data code consisting of the least significant 7 bits is output next by being selected according to the select signal from the control circuit 38. In phase with the data codes from the selector circuit 34, the word-length imformation representing 8 bits is selected and is output first from the selector circuit 35. Then the word-length information representing 7 bits is selected and is output. These two pieces of word-length information and two data codes are written in sequence into the flip-flop circuits 36 and 37, respectively, according to the clock signal CLK' from the control circuit 38. The rate of the clock signal CLK' is twice that of the clock signal CLK.

A word length of up to 16 bits can be represented by a 5-bit signal, and a word length of up to 8 bits can be represented by a 4-bit signal. Thus, in the above-mentioned example, $m_0 = 5$ and $m_1 = 4$. The data patterns of the input word-length information and the corresponding output word-length information are illustrated in FIG. 7. As can be seen from FIG. 7, if the word length of the input data code is less than or equal to 8 bits, the word length of the first output data code is equal to that of the input data code, and the word length of the second output data code is zero bits. If the word length of the input data code is from 9 to 16 bits, the word length of the first output data code is 8 bits, and the word length of the second output data code is equal to that of the input data code minus 8.

Figure 8:
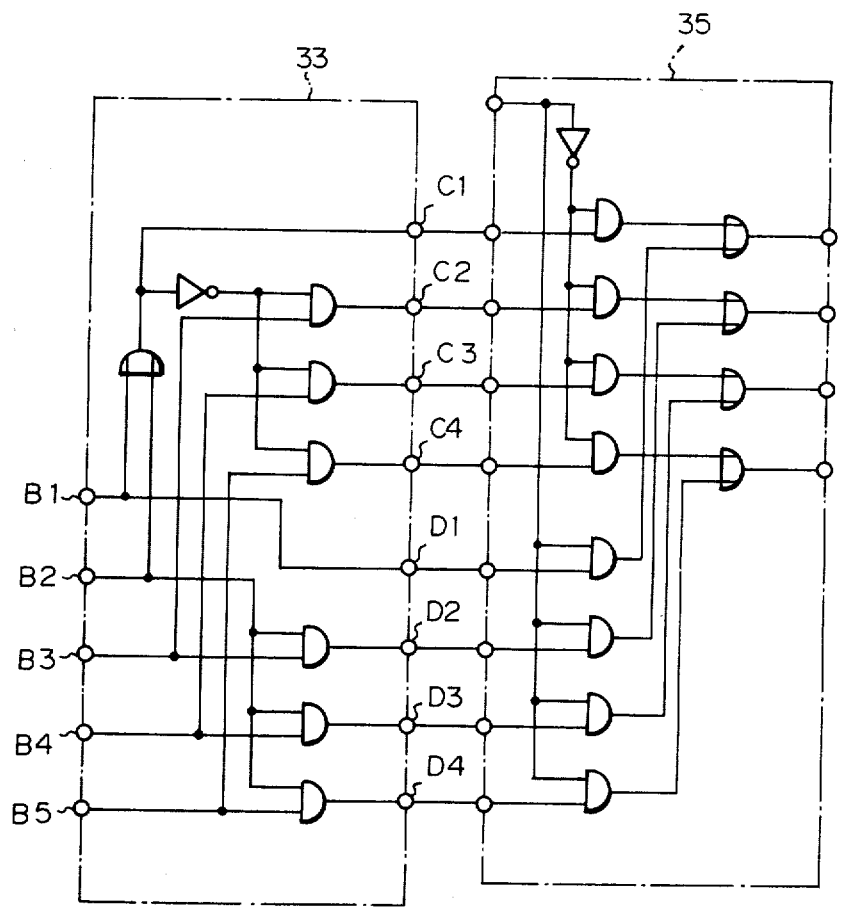
FIG. 8 is a detailed circuit diagram of the main parts of the preparation circuit of FIG. 6.

The word-length information conversion circuit 33 and the word-length selector circuit 35 may be constructed as shown in FIG. 8. In the word-length information conversion circuit 33 of FIG. 8, the word-length information B$_1$, B$_2$, - - -, B$_5$ of the input data code is converted into the word-length information C1, C2, - - -, C4 of the first output data code and the word-length information D1, D2, - - -, D4 of the second output data code.

In the above-mentioned preparation circuit 3 of FIG. 6, an input variable-word-length data code of up to 16 bits is divided into two output variable-word-length data codes of up to 8 bits. These output variable-word-length data codes are supplied in sequence to the data code conversion portion 4 and are converted into 8-bit data codes. Thus, in the above-mentioned data code conversion circuit of FIG. 5, an input variable-word-length data code of up to 16 bits can be processed by an 8-bit data code conversion portion 4. Of course, by increasing the number of divisions in the preparation circuit, an input variable-word-length data code greater than 16 bits can be processed by the conversion circuit of FIG. 6. For example, when the number of divisions in the preparation circuit is three, a variable-word-length data code of up to 24 bits can be processed.

Figure 9:
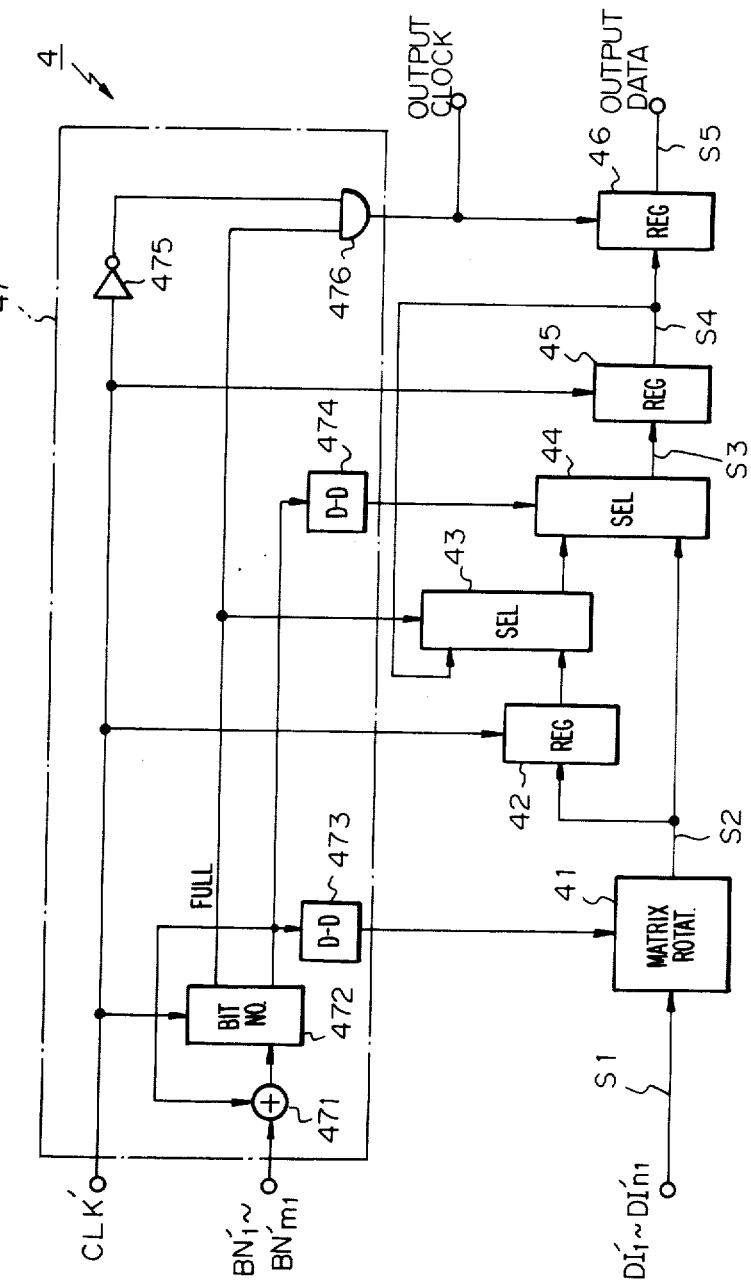
FIG. 9 is a circuit diagram of one embodiment of the data code conversion portion in the conversion circuit of FIG. 5.

One embodiment of the data code conversion portion 4 of FIG. 6 is illustrated in FIG. 9. The data code conversion portion 4 of FIG. 9 includes a matrix-type rotation or data-shift circuit 41 for receiving a variable-word-length data code of up to n$_1$ bits and a first register circuit 42 for receiving the n$_1$ bit output signal from the rotation circuit 41. Also included is a first selector circuit 43, a second selector circuit 44, a second register circuit 45, a third register circuit 46, and a control circuit 47 for controlling the above-mentioned circuits 41 through 46.

The first selector circuit 43 receives an output data signal from the first register circuit 42 and an output data signal from the second register circuit 45. The second selector circuit 44 receives an output data signal from the rotation circuit 41 and an output data signal from the first selector circuit 43. The second register circuit 45 receives an output data signal from the second selector circuit 44. The third register circuit 46 receives an output data signal from the second register circuit 45 and outputs the converted fixed-word-length data code. The control circuit 47 receives the word-length information signal BN'1 through BN'm₁ and a clock signal CLK'.

Figure 10:
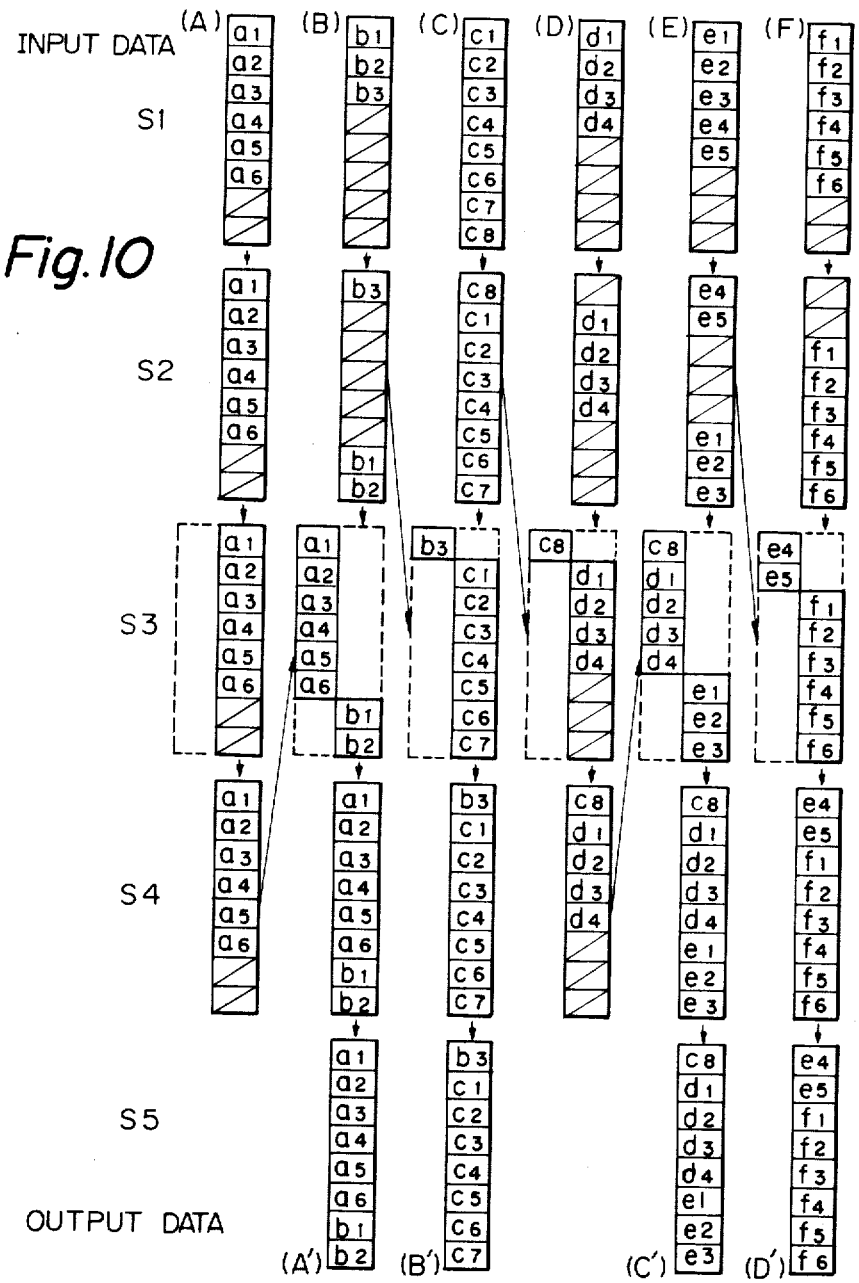
FIG. 10 is a diagram showing the conversion operation of the data code conversion portion of FIG. 9.

The operation of the data code conversion portion 4 of FIG. 9 is described with reference to an example of the input data codes in FIG. 10. Assume that the data code conversion portion 4 has an 8-bit construction and that the variable-word-length data codes (A) through (F) in FIG. 10 are input into the conversion portion 4 of FIG. 9 in sequence. The input data signal S1 is rotated by the bit number determined by the control signal from the control circuit 47 in the rotation circuit 41, and the rotated data signal S2 output from the rotation circuit 41 is supplied to the first register circuit 42 and to the second selector circuit 44. For example, the first input data (A) is output from the rotation circuit 41 without being rotated. Then the data (A) is selected and is output by the second selector circuit 44 as the signal S3 and is written into the second register circuit 45. In this case, since only 6 bits of effective data are written into the second register circuit 45, it is necessary to attach the leading 2 bits of the next input data (B) to the end of the first 6 bits.

Thus, the second input data (B) is shifted or rotated in the rotation circuit 41 to arrange the leading 2 bits of the data (B) at the end of the 8-bit data. This rotated data is supplied to the first register circuit 42 and to the second selector circuit 44. At this time, the output data S4 from the second register circuit 45 is selected by the first selector circuit 43 and is supplied to the second selector circuit 44. In the second selector circuit 44, the data from the first selector circuit 43 is selected with regard to the leading 6 bits and the data from the rotation circuit 41 is selected with regard to the remaining 2 bits. The combined 8-bits of data is output from the second selector circuit 44 (as S3). This data S3 is written into the second register circuit 45. At the same time, the data S2 from the rotation circuit 41 is written into the first register circuit 42. Since a full 8-bits of effective data has been written into the second register circuit 45, the output data S4 from the second register circuit 45 is written into the third register circuit 46 by the clock signal output clock from the control circuit 47. This data is then output from the third register circuit 46 as the first output data (A').

Then the third input data (C) is rotated by 1 bit in the rotation circuit 41 to be attached to the remaining 1 bit of the preceding input data (B), and the rotated data is supplied to the first register circuit 42 and to the second selector circuit 44. In this case, since the data not written into the second register circuit 45 remains in the first register circuit 42, the data output from the first register circuit 42 is selected by the first selector circuit 43 and is supplied to the second selector circuit 44. In the second selector circuit 44, the data from the first selector circuit 43 is selected with regard to the leading 1 bit, and the data S2 from the rotation circuit 41 is selected with regard to the remaining 7 bits. The combined data S3 output from the second selector circuit 44 is supplied to the second register circuit 45 and is written into the second register circuit 45. Since 8 bits of effective data are written into the second register circuit 45, the output data S4 from the second register circuit 45 is written into the third register circuit 46 and is output from the third register circuit 46 as the second output data (B').

Then the same operation as described above is repeated. That is, when data bits which have not been written into the second register circuit 45 remain in the first register circuit 42, the new input data is attached to the end of the remaining bits, and the combined data is written into the second register circuit 45. When the effective bits written into the second register circuit 45 do not number 8 bits, the new input data is attached to the end of the data already written into the second register circuit 45. When 8 bits of effective data are written into the second register circuit 45 number 8 bits, the data output from the second register circuit 45 is written into the third register circuit 46 and is output from the third register circuit 46 as converted output data.

The above-mentioned operation of the data code conversion portion 4 can be carried out under the control of the control circuit 47. The control circuit 47 may be constructed as shown in FIG. 9. The control circuit 47 of FIG. 9 includes an adder circuit 471, a bit number register 472, digital-to-digital converter circuits 473 and 474, an inverter circuit 474, and an AND gate circuit 476. The word-length information BN1 through BNm is supplied to the adder circuit 471 and is added to the output of the bit number register 472. The output of the adder circuit 471 is supplied to the bit number register 472 and is written into the bit number register 472. The bit number register 472 outputs bit number data indicating the number of bits of effective data in the second register circuit 45 and a full signal FULL indicating that 8 bits of effective data have been written into the second register circuit 45.

Figure 11:
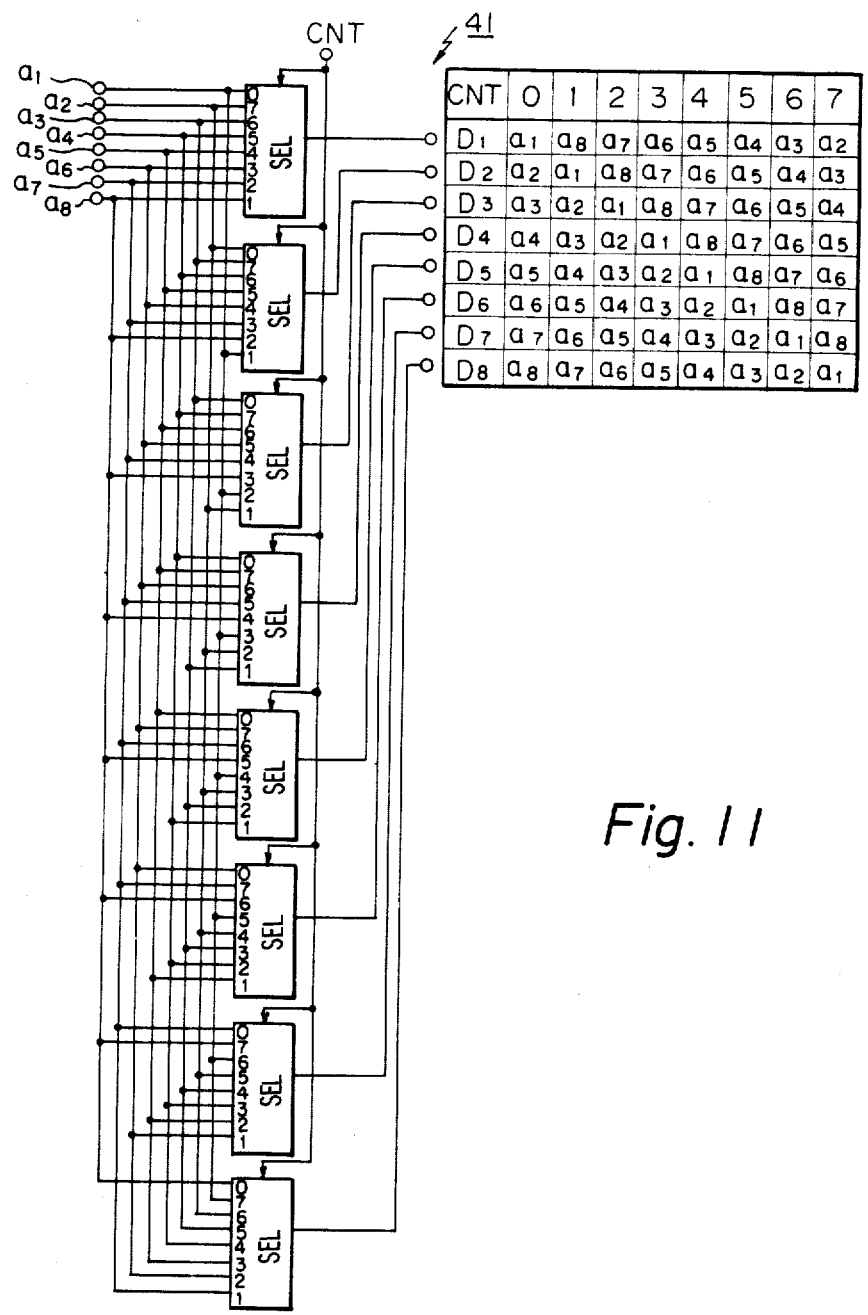
FIG. 11 is a detailed circuit diagram of the rotation circuit in FIG. 9.

Bit number data from the bit number register 472 is supplied to the digital-to-digital converter circuits 473 and 474. In the converter circuits 473 and 474, the bit number data is converted into control signals for the rotation circuit 41 and for the second selector circuit 44, respectively. The rotation circuit 41 may be constructed as illustrated in FIG. 11. In the rotation circuit 41 of FIG. 11, the input data bits a1, a2, - - - , a8 are rotated by the bit number determined by the control signal CNT from the control circuit 47, as FIG. 11 indicates.

Figure 12:
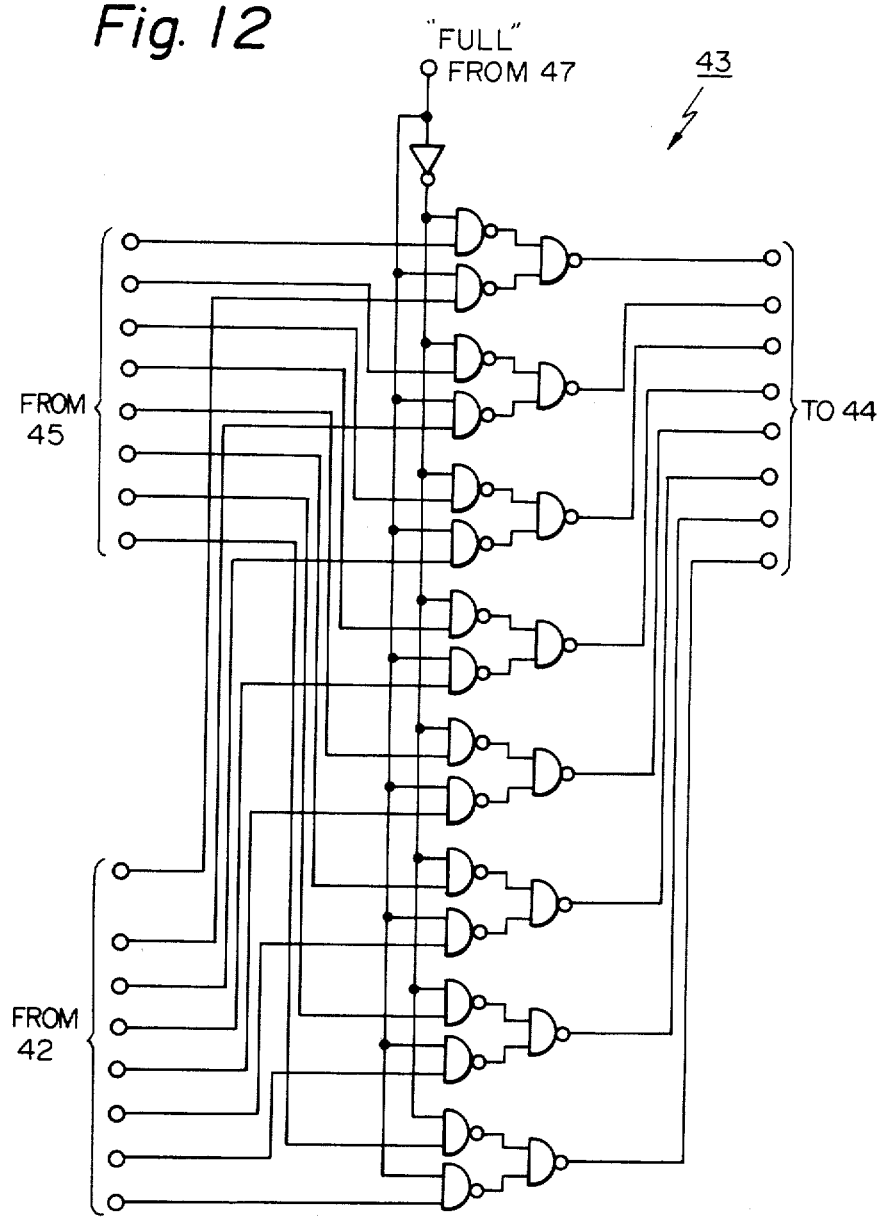
FIG. 12 is a detailed circuit diagram of the first selector circuit in FIG. 9.

The first selector circuit 43 in FIG. 9 may be constructed as illustrated in FIG. 12. In the first selector circuit 43 of FIG. 12, when the full signal FULL from the control circuit 47 has a "low", logic level data from the second register circuit 45 is selected and is output to the second selector circuit 44. When the full signal FULL from the control circuit 47 has a "high" logic level, data from the first register circuit 42 is selected and is output to the second selector circuit 44.

Figure 13:
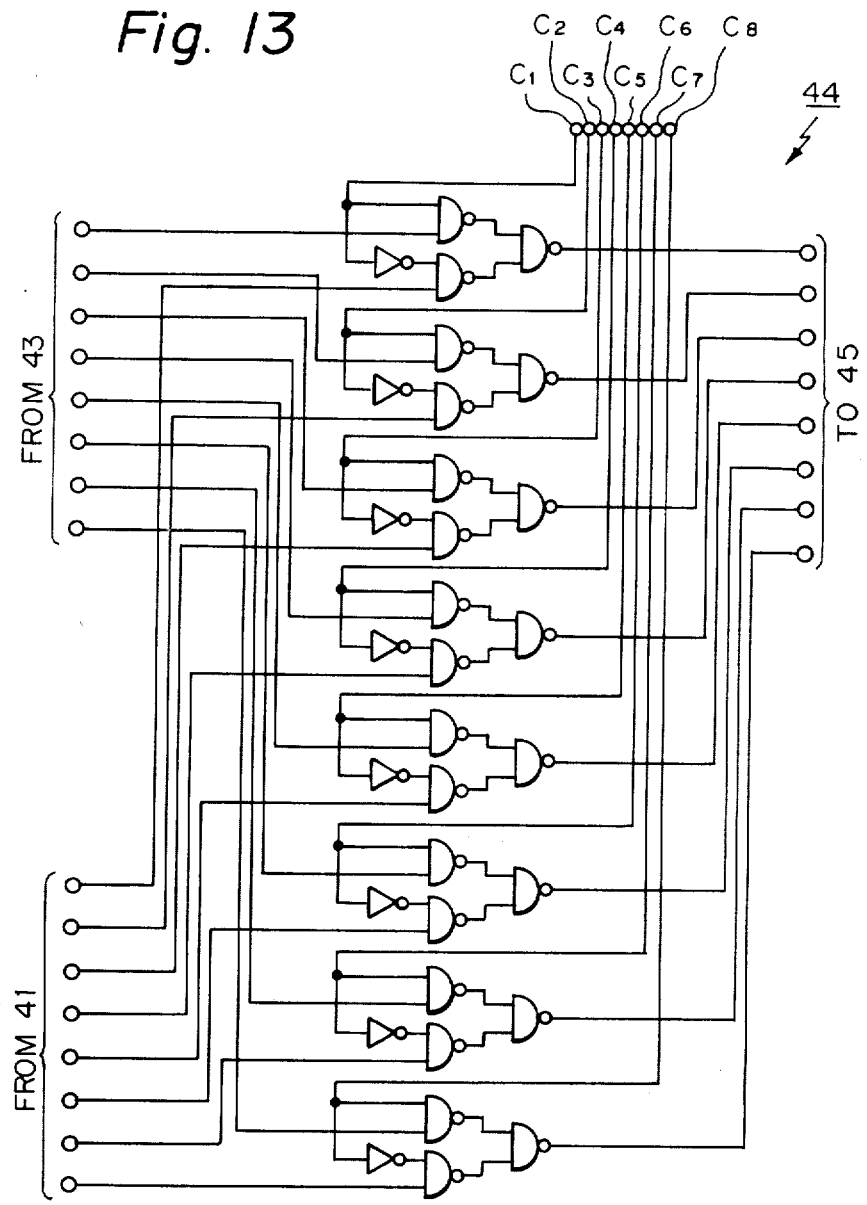
FIG. 13 is a detailed circuit diagram of the second selector circuit in FIG. 9.

The second selector circuit 44 in FIG. 9 may be constructed as illustrated in FIG. 13. In the second selector circuit 44 of FIG. 13, with regard to each bit of input data, selection of either the data from the first selector circuit 43 or the data from the rotation circuit 41 is carried out by the control signals C1 through C8 from the control circuit 47. The control signals C1 through C8, in FIG. 14, are determined in accordance with the bit number data in the converter digital-to-digital circuit 474 of FIG. 9. Thus, in the second selector circuit 44, the number of bits selected from the first selector circuit 43, from top to bottom in FIG. 13, is equal to the bit number in the register 472. The remaining bits supplied to the second register 45 come from the corresponding bits of the rotation circuit 41.

In accordance with the data code conversion portion 4 of FIG. 9, the control operation and the control circuit can be simplified as compared to the data code conversion circuit disclosed in the above-mentioned Japanese Patent Application No. 55-017,259.

We claim:

1. A digital data code conversion circuit for variable-word-length data codes, comprising:
    a data code conversion portion for converting first variable-word-length data codes having a word-length less than or equal to the first predetermined number into fixed word-length data codes having a word-length equal to the first predetermined number by dividing and combining the first variable-word-length data codes; and
    a preparation circuit, operatively connected to and preceding said data code conversion portion, for dividing a second variable-word-length data code, received at a data input rate, having a word-length greater than the first predetermined number and less than or equal to a second predetermined number into the first variable-word-length data codes each having a word-length less than or equal to the first predetermined number and producing word-length information for the first variable-word-length data codes, said data code conversion portion being operated at an operation rate proportional to the data input rate multiplied by the second predetermined number and divided by the first predetermined number.

2. A digital data code conversion circuit for variable-word-length data codes as defined in claim 1, wherein said data code conversion portion comprises:
    a data-shift circuit, operatively connected to said preparation circuit, for receiving the first variable-word-length data codes from said preparation circuit, shifting the position of the bits of the first variable-word-length data codes and outputting shifted data;
    a selector circuit, operatively connected to said data-shift circuit, for receiving the shifted data output from said data-shift circuit and outputting combined data;
    a first register circuit, operatively connected to said data-shift circuit and said selector circuit, for receiving the shifted data output from said data-shift circuit and holding the shifted data for said selector circuit;
    a second register circuit, operatively connected to said selector circuit, for receiving the combined data output from said selector circuit, returning the combined data to said selector circuit and outputting the fixed-word length data; and
    a control circuit, operatively connected to said data-shift circuit, said selector circuit and said first and second registers, for receiving the word-length information from said preparation circuit, controlling said data-shift circuit to shift the first variable-word-length data codes by a bit number determined in accordance with the word-length information, and controlling said selector circuit where said selector circuit combines the combined data from said second register circuit with the shifted data from said data-shift circuit when the combined data in said second register circuit has a word-length less than the first predetermined number and where said selector circuit combines the shifted data from said first register circuit with the shifted data from said data-shift circuit when the combined data in said second register circuit has a word-length equal to the first predetermined number.

3. A digital data code conversion circuit for variable-word-length data codes as defined in claim 1, wherein said preparation circuit comprises:
    a data code selector circuit, operatively connected to said data code conversion portion and to receive the second variable-word-length data code, for receiving the second variable-word-length data code and selecting portions of the second variable-word-length data code as first variable-word-length data codes until all of the second variable-word-length data code has been selected; and
    word-length generating means, operatively connected to receive word-length information for the second variable-word-length data code, for receiving word-length information for the second variable-word-length data code and generating word-length information for each of the first variable-word-length data codes selected by said data code selector circuit.

4. A digital data code conversion circuit for variable-word-length data codes as defined in claim 3, wherein said word-length generating means is operatively connected to receive a clock signal and comprises:
    a word-length information conversion circuit comprising:
        a first OR gate operatively connected to receive first and second highest order bits of the word-length information for the second variable-word-length data code;
        a first inverter operatively connected to said first OR gate;
        a first AND gate operatively connected to said first inverter and to receive a third highest order bit of the word-length information for the second variable-word-length data code;
        a second AND gate operatively connected to said first inverter and to receive a fourth highest order bit of the word-length information for the second variable-word-length data code;
        a third AND gate operatively connected to said first inverter and to receive a fifth highest order bit of the word-length information for the second variable-word-length data code;
        a fourth AND gate operatively connected to receive the second and third highest order bits of the word-length information for the second variable-word-length data code;
        a fifth AND gate operatively connected to receive the second and fourth highest order bits of the word-length information for the second variable-word-length data code; and
        a sixth AND gate operatively connected to receive the second and fifth highest order bits of the word-length information for the second variable-word-length data code; and
    a word-length selector circuit, comprising:
        a second inverter operatively connected to receive the clock signal;
        a seventh AND gate operatively connected to said first OR gate and said second inverter;
        an eighth AND gate operatively connected to said first AND gate and said second inverter;

a ninth AND gate operatively connected to said second AND gate and said second inverter;

a tenth AND gate operatively connected to said third AND gate and said second inverter;

an eleventh AND gate operatively connected to receive the first highest order bit of the word-length information about the second variable-word-length data code and the clock signal;

a twelfth AND gate operatively connected to said fourth AND gate and to receive the clock signal;

a thirteenth AND gate operatively connected to said fifth AND gate and to receive the clock signal;

a fourteenth AND gate operatively connected to said sixth AND gate and to receive the clock signal;

a second OR gate operatively connected to said seventh and eleventh AND gates and generating a first bit of the word-length information for the first variable-word-length data code;

a third OR gate operatively connected to said eighth and twelfth AND gates and generating a second bit of the word-length information for the first variable-word-length data code;

a fourth OR gate operatively connected to said ninth and thirteenth AND gate and generating a third bit of the word-length information for the first variable-word-length data code; and a fifth OR gate operatively connected to said tenth and fourteenth AND gates and generating a fourth bit of the word-length information for the first variable-word-length data code.

5. A digital data code conversion circuit for variable-word-length data codes as defined in claim 3, wherein said preparation circuit further comprises:

a first flip-flop operatively connected to said word-length generating means and to receive word-length information about the second variable-word-length data code;

a second flip-flop operatively connected to said data code selector circuit and to receive the second variable-word-length data code;

a third flip-flop, operatively connected to said word-length generating means, for storing word-length information for each of the first variable-word-length data codes; and a fourth flip-flop, operatively connected to said data code selector circuit, for storing the first variable-word-length data codes.

* * * * *

UNITED STATES PATENT AND TRADEMARK OFFICE
CERTIFICATE OF CORRECTION

PATENT NO. : 4,593,267
DATED : June 3, 1986
INVENTOR(S) : Kuroda et al.

It is certified that error appears in the above-identified patent and that said Letters Patent is hereby corrected as shown below:

```
Column 2, line 48, "FIGS." should be --FIG.--;
     after "series" insert --;--.
Column 3, line 25, "substracter" should be --subtracter--.
Column 4, line 16, "digital-digital" should be
     --digital-to-digital--;
          line 17, "date" should be --data--;
          line 26, "DN_m" should be --BN_m--;

line 63, after "n" insert --,--.
Column 7, line 51, "output clock" should be --OUTPUT CLOCK--.
Column 8, line 16, delete "number 8 bits";
          line 27, "circuit 474" should be --circuit 475--;
          line 51, ", logic level" should be --logic level,--;
          line 65, "converter digital-to-digital" should be
     --digital-to-digital converter--.
Column 12, line 2, "gate" should be --gates--.
```

Signed and Sealed this

Ninth Day of September 1986

[SEAL]

Attest:

DONALD J. QUIGG

Attesting Officer    Commissioner of Patents and Trademarks